(12) United States Patent
Solo De Zaldivar

(10) Patent No.: US 7,397,078 B2
(45) Date of Patent: Jul. 8, 2008

(54) NON-VOLATILE SEMICONDUCTOR MEMORY

(75) Inventor: Jose Solo De Zaldivar, Waedenswil (CH)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/488,377

(22) PCT Filed: Aug. 26, 2002

(86) PCT No.: PCT/IB02/03529

§ 371 (c)(1), (2), (4) Date: Jul. 19, 2006

(87) PCT Pub. No.: WO03/019664

PCT Pub. Date: Mar. 6, 2003

(65) Prior Publication Data

US 2006/0281247 A1  Dec. 14, 2006

(30) Foreign Application Priority Data

Aug. 28, 2001  (DE) .................. 101 41 962

(51) Int. Cl.
H01L 27/108 (2006.01)

(52) U.S. Cl. ............... 257/298; 257/303; 257/E27.103; 438/254

(58) Field of Classification Search .......... 257/300, 257/298, 303, 304, 306, 311, 314, 315, 532, 257/E27.103; 438/253, 254, 257
See application file for complete search history.

(56) References Cited

U.S. PATENT DOCUMENTS

| 5,880,991 | A | * | 3/1999 | Hsu et al. | 365/182 |
| 5,981,335 | A | * | 11/1999 | Chi | 438/253 |
| 5,998,264 | A | * | 12/1999 | Wu | 438/260 |
| 6,784,473 | B2 | * | 8/2004 | Sakai et al. | 257/295 |
| 6,965,142 | B2 | * | 11/2005 | Diorio et al. | 257/315 |

OTHER PUBLICATIONS

Patent abstracts of Japan. vol. 1996, No. 08, Aug. 30, 1996.

* cited by examiner

*Primary Examiner*—Zandra Smith
*Assistant Examiner*—Paul E Patton
(74) *Attorney, Agent, or Firm*—Peter Zawilski

(57) ABSTRACT

A non-volatile semiconductor memory comprising at least one EPROM/EEPROM memory cell that includes a floating gate transistor and a coupling capacitor, said floating gate transistor comprising a field effect transistor and a polysilicon layer, the coupling capacitor comprising a first electrode and a second electrode as well as a dielectric interposed between said electrodes, the first electrode of the coupling capacitor being electrically coupled with the polysilicon layer of the floating gate transistor, and the control electrode of the floating gate transistor forming the second electrode of the coupling capacitor. The invention also relates to a display device and an arrangement for controlling a display device, which each comprise a non-volatile semiconductor memory.

20 Claims, 2 Drawing Sheets

NON-VOLATILE SEMICONDUCTOR MEMORY

The invention relates to a non-volatile semiconductor memory comprising at least one EPROM (Erasable and Programmable Read-Only Memory)/EEPROM (Electrically Erasable and Programmable Read-Only Memory) memory cell containing a floating gate transistor and a coupling capacitor, said floating gate transistor comprising a field effect transistor and a polysilicon layer, and the coupling capacitor comprising a first electrode and a second electrode as well as a dielectric interposed between said electrodes. The invention also relates to a display device and to an arrangement for controlling a display device.

EPROM/EEPROM memory cells are used to build up non-volatile semiconductor memories, in particular, for integrated circuits (embedded EPROM/EEPROM) and, in general, for use in computers or microprocessor-controlled devices for storing programs and/or data that should be retained also when no supply voltage is applied. Also so-termed driver circuits for display screens, for example liquid crystal display screens, comprise several non-volatile semiconductor memories to adjust certain parameters that optimize the visual contrast of the display screen.

An EPROM/EEPROM memory cell generally comprises a floating gate transistor whose floating gate is positively charged or negatively charged and hence represents, respectively, an erased or a programmed state. An EPROM/EEPROM memory cell may further comprise a coupling capacitor that induces the voltage applied to the control electrode into the floating gate. An EEPROM memory cell generally also comprises a second transistor, which is an access transistor.

Customarily, the control electrode and the floating gate are each formed by a polysilicon layer. This has the disadvantage that the manufacturing process is complicated and hence expensive. A further drawback resides in that a comparatively large area of the semiconductive substrate is needed to accommodate the separate coupling capacitor.

Therefore, it is an object of the invention to provide a non-volatile semiconductor memory comprising an improved EPROM/EEPROM memory cell.

This object is achieved by a non-volatile semiconductor memory comprising at least one EPROM/EEPROM memory cell that includes a floating gate transistor and a coupling capacitor, said floating gate transistor comprising a field effect transistor and a polysilicon layer, the coupling capacitor comprising a first electrode and a second electrode as well as a dielectric interposed between said electrodes, the first electrode of the coupling capacitor being electrically coupled with the polysilicon layer of the floating gate transistor, and the control electrode of the floating gate transistor forming the second electrode of the coupling capacitor.

It is advantageous that the floating gate transistor and the coupling capacitor of a memory cell are arranged one above the other or one inside the other rather than next to one another. By virtue thereof, the space required by the non-volatile semiconductor memory on the semiconductor substrate can be reduced and a saving in valuable semiconductor material can be made. The manufacturing costs are further reduced as only one polysilicon layer is used.

In addition, the parasitic capacitances of such a floating gate are lower than the parasitic capacitances of a floating gate made of an isolated polysilicon layer, as is customarily used in a floating gate transistor.

The advantageous embodiments of the invention as claimed in the sub-claims enable the manufacturing steps for such an EPROM/EEPROM memory cell to be inserted without additional expenditure into a customary CMOS (Complementary Metal Oxide Semiconductor) manufacturing method for integrated circuits.

The invention further relates to a display device equipped with an arrangement for controlling the display device and to an arrangement for controlling a display device, which arrangement comprises a non-volatile semiconductor memory including at least one EPROM/EEPROM memory cell comprising a floating gate transistor and a coupling capacitor, said floating gate transistor comprising a field effect transistor and a polysilicon layer, the coupling capacitor comprising a first electrode and a second electrode as well as a dielectric interposed between said electrodes, the first electrode of the coupling capacitor being electrically coupled with the polysilicon layer of the floating gate transistor, and the control electrode of the floating gate transistor forming the second electrode of the coupling capacitor.

These and other aspects of the invention are apparent from and will be elucidated with reference to the embodiments described hereinafter.

A display device, for example a liquid crystal display screen, comprises at least an arrangement, for example an integrated circuit, for controlling said display device. For storing data, the arrangement for controlling a display device may comprise non-volatile semiconductor memories having one or more EPROM/EEPROM memory cells. An EPROM memory cell of a non-volatile semiconductor memory comprises a floating gate transistor and a coupling capacitor. An EEPROM memory cell generally additionally comprises an access transistor. To electrically address the individual components in a memory cell, a non-volatile semiconductor memory comprises lines, i.e. word lines and bit lines.

The floating gate transistor comprises a field effect transistor, preferably a MOS (Metal Oxide Semiconductor) field effect transistor and a polysilicon layer. It is particularly preferred that the field effect transistor is an n-channel MOS field effect transistor. A field effect transistor comprises an emitter (source), a collector (drain) and a control electrode. The coupling capacitor preferably is an MIM (Metal-Insulator-Metal) capacitor comprising two metallic electrodes.

A non-volatile memory comprising at least one EPROM/EEPROM memory cell can be manufactured using, for example, CMOS technology. To manufacture an EPROM/EEPROM memory cell in accordance with the invention, use can be made of a CMOS process wherein a polysilicon layer and two or more metal layers are provided.

Figure 1:
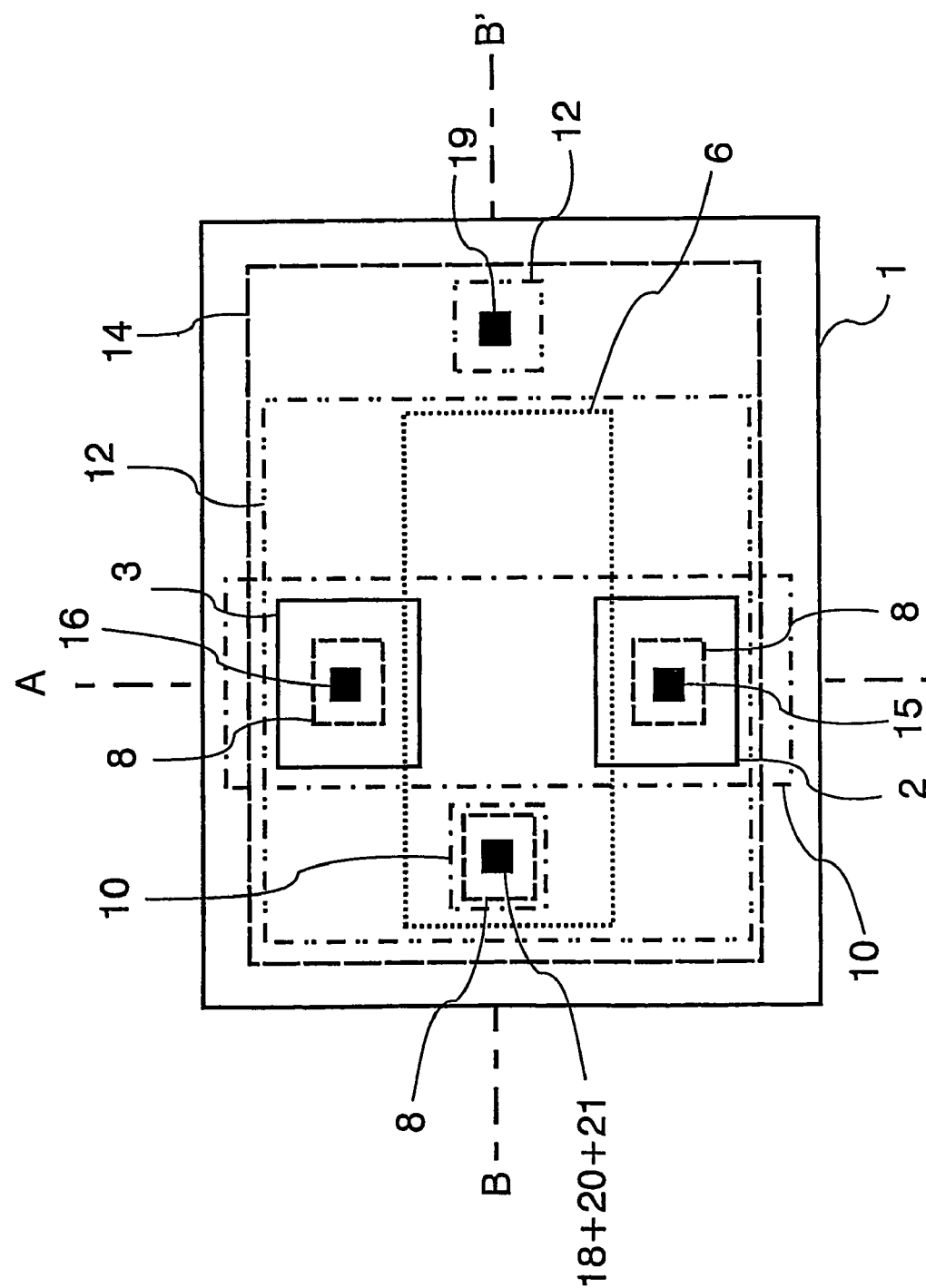
FIG. 1 is a plan view of an EPROM memory cell of a non-volatile memory.

FIG. 1 is a plan view of an embodiment of an EPROM memory cell of a non-volatile memory, which memory cell can be manufactured by means of a CMOS process, in which embodiment a polysilicon layer and four electroconductive layers, so-termed interconnection layers are provided. The EPROM memory cell comprises a floating gate transistor and a coupling capacitor. FIG. 1 shows the semiconductive substrate 1, doped semiconductor regions 2, 3 in the semiconductive substrate 1, a polysilicon layer 6, electroconductive interconnection layers 8, 10, 12, 14, and electroconductive contact holes (vias) 15, 16, 18, 19, 20, 21, which electrically interconnect the individual layers and regions, such as the polysilicon layer 6, the doped semiconductor regions 2, 3 and the interconnection layers 8, 10, 12, 14. The dielectric layers situated between the semiconductive substrate 1, polysilicon layer 6 and the individual interconnection layers 8, 10, 12, 14 are not shown in FIG. 1. A field oxide layer that electrically insulates the floating gate transistors of the individual EPROM memory cells are not shown either.

Figure 2:
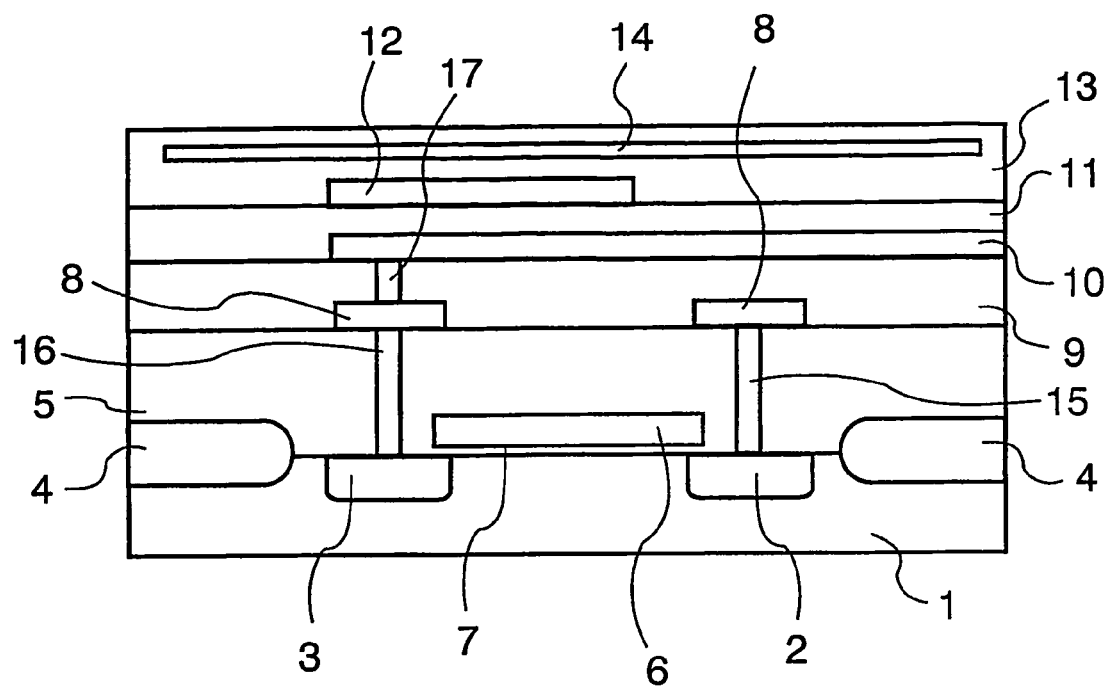
FIG. 2 is a diagrammatic cross-sectional view of the EPROM memory cell taken along the intersection line A-A'.

FIG. 2 is a diagrammatic cross-sectional view taken on the intersection line A-A' of the embodiment of an EPROM memory cell shown in FIG. 1. Semiconductor regions 2, 3, which are preferably n-doped, are implanted into the semiconductive substrate 1, which is preferably p-doped. The first semiconductor region 2 is the collector (drain) and the second semiconductor region 3 is the emitter (source) of the floating gate transistor. On the semiconductive substrate 1 there is a field oxide layer 4 that is interrupted in the active regions of the semiconductive substrate 1, i.e. in the areas of the first and the second semiconductor region 2, 3. The field oxide layer 4 preferably comprises $SiO_2$. A first dielectric layer 5 is present on the first and the second semiconductor region 2, 3 as well as on the semiconductive substrate 1 sandwiched between said regions and on the field oxide layer 4. A polysilicon layer 6 is embedded in the first dielectric layer 5. The polysilicon layer 6 preferably comprises doped polysilicon and is embedded in the first dielectric layer 5 in such a manner that only a thin layer of the material of the first dielectric layer 5 is present between the semiconductive substrate 1, or the first and the second semiconductor region 2, 3, and the polysilicon layer 6. This so-termed tunnel oxide region 7 is so thin that electrons are capable of tunneling from the semiconductive substrate 1 to the polysilicon layer 6 or from the polysilicon layer 6 to the first semiconductor region 2. (Fowler-Nordheim tunneling).

A first interconnection layer 8 is provided in accordance with a structure on the first dielectric layer 5. The first interconnection layer 8 is structured such that a part of the first interconnection layer 8 electrically contacts the second semiconductor region 3, i.e. the emitter, via a first contact hole 16. In addition, another part of the first interconnection layer 8 electrically contacts the first semiconductor region 2, i.e. the collector, via a second contact hole 15. In this region, the first interconnection layer 8 serves as a bit line that addresses the emitter and the collector.

A second dielectric layer 9 is present on the first dielectric layer 5 and on the first interconnection layer 8. A second interconnection layer 10 is present on the second dielectric layer 9. Said second interconnection layer 10 is electrically connected to the first interconnection layer 8 by means of a third contact hole 18. A third dielectric layer 11 is provided on the second interconnection layer 10. A third interconnection layer 12 is provided on the third dielectric layer 11, said third interconnection layer being structured such that it serves as the first electrode of the coupling capacitor. The third interconnection layer 12 is provided with a fourth dielectric layer 13. A fourth interconnection layer 14, which is structured such that it serves as a control electrode of the floating gate transistor, is embedded in the fourth dielectric layer 13. In addition, the fourth interconnection layer 14 serves as the second electrode of the coupling capacitor. By suitably structuring the fourth interconnection layer 14, it is achieved that said interconnection layer additionally serves as a word line for controlling the control electrode.

Outside the area of the non-volatile memory, the first interconnection layer 8 and the second interconnection layer 10 can be structured such that they form further components of the arrangement for controlling the display device. Such a component may be, for example, a column decoder for an array of non-volatile semiconductor memories, an input-output chip (I/O chip), a SRAM (Static Random Access Memory) memory cell, a ROM (Read-Only Memory) memory cell or a logic component.

Figure 3:
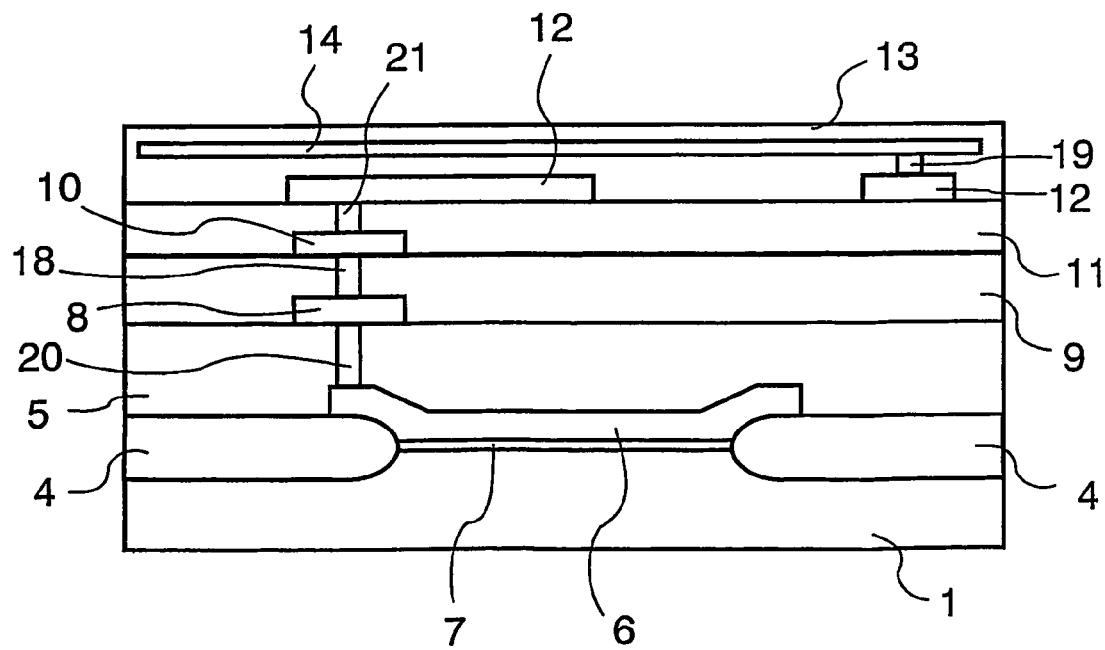
FIG. 3 is a diagrammatic cross-sectional view of the EPROM memory cell taken along the intersection line B-B'.

FIG. 3 is a diagrammatic cross-sectional view taken along the intersection line B-B' of the embodiment of an EPROM memory cell shown in FIG. 1. As is shown in FIG. 3, the third interconnection layer 12 is electrically connected, via a fourth contact hole 21, to the second interconnection layer 10, via a fifth contact hole 18 to the first interconnection layer 8, and via a sixth contact hole 20 to the polysilicon layer 6 of the floating gate transistor. Besides, the fourth contact hole 21 connects the third interconnection layer 12 to the second interconnection layer 10, the fifth contact hole 18 connects the second interconnection layer 10 to the first interconnection layer 8, and the sixth contact hole 20 connects the first interconnection layer 8 to the polysilicon layer 6. The third interconnection layer 12 and the polysilicon layer 6 form the floating gate of the floating gate transistor. The contact hole 19 establishes electric contact between the fourth interconnection layer 14 and a part of the third interconnection layer 12.

The dielectric layers 5, 9, 11, 13 preferably comprise $SiO_2$, $Si_3N_4$ or a combination of these materials, and are preferably provided by means of, for example, PECVD (Plasma-Enhanced Chemical Vapor Deposition) processes. The interconnection layers 8, 10, 12, 14 as well as the electroconductive contact holes 15, 16, 18, 19, 20, 21 comprise preferably Ti/TiN/Al(Cu) as the electroconductive material. Alternatively, the interconnection layers 8, 10, 12, 14 may each comprise different electroconductive materials.

In a further possible embodiment the EPROM memory cell only comprises two interconnection layers, one interconnection layer serving as the first electrode of the coupling capacitor, and the second interconnection layer serving as the control electrode and the second electrode of the coupling capacitor, and two dielectric layers.

Programming, erasing and reading an EPROM/EEPROM memory cell in accordance with the invention takes place by means of customary processes and methods.

The invention claimed is:

1. A non-volatile semiconductor memory comprising:
   at least one EPROM/EEPROM memory cell that includes
      a floating gate transistor including a field effect transistor and a polysilicon layer;
      a first deposited metal interconnection layer having metal interconnects and a first metal electrode;
      a second deposited metal interconnection layer having a second metal electrode;
      a coupling capacitor that includes the first metal electrode, the second metal electrode, and a dielectric interposed between said first and second metal electrodes, the second metal electrode forming a control electrode of the floating gate transistor;
      a first via that electrically couples the first metal electrode to the polysilicon layer of the floating gate transistor; and
      a second via that electrically couples the second metal electrode to one of the metal interconnects of the first deposited metal interconnection layer.

2. A non-volatile semiconductor memory as recited in claim 1, wherein the coupling capacitor is a MIM (Mental-Insulator-Metal) capacitor.

3. A display device equipped with an arrangement for controlling the display device, which arrangement comprises:

a non-volatile semiconductor memory including at least one EPROM/EEPROM memory cell containing
a floating gate transistor having a field effect transistor and a polysilicon layer;
a first deposited metal interconnection layer having metal interconnects and a first metal electrode;
a second deposited metal interconnection layer having a second metal electrode;
a coupling capacitor that includes the first metal electrode, the second metal electrode, and a dielectric interposed between said first and second metal electrodes, the second metal electrode forming a control electrode of the floating gate transistor;
a first via that electrically couples the first metal electrode to the polysilicon layer of the floating gate transistor; and
a second via that electrically couples the second metal electrode to one of the metal interconnects of the first deposited metal interconnection layer.

4. An arrangement for controlling a display device, which arrangement comprises:
a non-volatile semiconductor memory including at least one EPROM/EEPROM memory cell containing
a floating gate transistor having a field effect transistor and a polysilicon layer;
a first deposited metal interconnection layer having metal interconnects and a first metal electrode:
a second deposited metal interconnection layer having a second metal electrode;
a coupling capacitor that includes the first metal electrode, the second metal electrode, and a dielectric interposed between said first and second metal electrodes, the second metal electrode forming a control electrode of the floating gate transistor;
a first via that electrically couples the first metal electrode to the polysilicon layer of the floating gate transistor; and
a second via that electrically couples the second metal electrode to one of the metal interconnects of the first deposited metal interconnection layer.

5. A non-volatile semiconductor memory as recited in claim 1, wherein the first and second metal electrodes include at least one of titanium, aluminum and copper.

6. A non-volatile semiconductor memory as recited in claim 1, wherein the at least one EPROM/EEPROM memory cell further includes
a third deposited metal interconnection layer having metal interconnects;
a third via that electrically couples one of the metal interconnects of the third deposited metal interconnection layer to a source of the floating gate transistor;
a fourth via that electrically couples one of the metal interconnects of the third deposited metal interconnection layer to a drain of the floating gate transistor; and
a fifth via that electrically couples one of the metal interconnects of the third deposited metal interconnection layer to the polysilicon layer of the floating gate transistor.

7. A non-volatile semiconductor memory as recited in claim 6, wherein the at least one EPROM/EEPROM memory cell further includes
a fourth deposited metal interconnection layer having metal interconnects;
a sixth via that electrically couples one of the metal interconnects of the fourth deposited metal interconnection layer to one of the metal interconnects of the third deposited metal interconnection layer; and a seventh via that electrically couples one of the metal interconnects of the fourth deposited metal interconnection layer to the metal interconnect of the third deposited metal interconnection layer that is electrically coupled to the polysilicon layer of the floating gate transistor, and
wherein the first via electrically couples the first metal electrode of the coupling capacitor to the metal interconnect of the fourth deposited metal layer that is electrically coupled to the metal interconnect of the third deposited metal interconnection layer that is electrically coupled to the polysilicon layer of the floating gate transistor.

8. A non-volatile semiconductor memory as recited in claim 1, wherein the dielectric interposed between the first and second metal electrodes of the coupling capacitor includes at least one of $SiO_2$ and $Si_3N_4$.

9. A display device as recited in claim 3, wherein the coupling capacitor is a MIM (Metal-Insulator-Metal) capacitor.

10. A display device as recited in claim 3, wherein the first and second metal electrodes include at least one of titanium, aluminum and copper.

11. A display device as recited in claim 3, wherein the at least one EPROM/EEPROM memory cell further includes
a third deposited metal interconnection layer having metal interconnects;
a third via that electrically couples one of the metal interconnects of the third deposited metal interconnection layer to a source of the floating gate transistor;
a fourth via that electrically couples one of the metal interconnects of the third deposited metal interconnection layer to a drain of the floating gate transistor; and
a fifth via that electrically couples one of the metal interconnects of the third deposited metal interconnection layer to the polysilicon layer of the floating gate transistor.

12. A display device as recited in claim 11, wherein the at least one EPROM/EEPROM memory cell further includes
a fourth deposited metal interconnection layer having metal interconnects;
a sixth via that electrically couples one of the metal interconnects of the fourth deposited metal interconnection layer to one of the metal interconnects of the third deposited metal interconnection layer; and
a seventh via that electrically couples one of the metal interconnects of the fourth deposited metal interconnection layer to the metal interconnect of the third deposited metal interconnection layer that is electrically coupled to the polysilicon layer of the floating gate transistor, and
wherein the first via electrically couples the first metal electrode of the coupling capacitor to the metal interconnect of the fourth deposited metal layer that is electrically coupled to the metal interconnect of the third deposited metal interconnection layer that is electrically coupled to the polysilicon layer of the floating gate transistor.

13. A display device as recited in claim 3, wherein the dielectric interposed between the first and second metal electrodes of the coupling capacitor includes at least one of $SiO_2$ and $Si_3N_4$.

14. An arrangement for controlling a display device as recited in claim 4, wherein the coupling capacitor is a MIM (Metal-Insulator-Metal) capacitor.

15. An arrangement for controlling a display device as recited in claim 4, wherein the first and second metal electrodes include at least one of titanium, aluminum and copper.

16. An arrangement for controlling a display device as recited in claim 4, wherein the at least one EPROM/EEPROM memory cell further includes
 a third deposited metal interconnection layer having metal interconnects;
 a third via that electrically couples one of the metal interconnects of the third deposited metal interconnection layer to a source of the floating gate transistor;
 a fourth via that electrically couples one of the metal interconnects of the third deposited metal interconnection layer to a drain of the floating gate transistor; and
 a fifth via that electrically couples one of the metal interconnects of the third deposited metal interconnection layer to the polysilicon layer of the floating gate transistor.

17. An arrangement for controlling a display device as recited in claim 16, wherein the at least one EPROM/EEPROM memory cell further includes
 a fourth deposited metal interconnection layer having metal interconnects;
 a sixth via that electrically couples one of the metal interconnects of the fourth deposited metal interconnection layer to one of the metal interconnects of the third deposited metal interconnection layer; and
 a seventh via that electrically couples one of the metal interconnects of the fourth deposited metal interconnection layer to the metal interconnect of the third deposited metal interconnection layer that is electrically coupled to the polysilicon layer of the floating gate transistor, and
 wherein the first via electrically couples the first metal electrode of the coupling capacitor to the metal interconnect of the fourth deposited metal layer that is electrically coupled to the metal interconnect of the third deposited metal interconnection layer that is electrically coupled to the polysilicon layer of the floating gate transistor.

18. An arrangement for controlling a display device as recited in claim 4, wherein the dielectric interposed between the first and second metal electrodes of the coupling capacitor includes at least one of $SiO_2$ and $Si_3N_4$.

19. An arrangement for controlling a display device as recited in claim 4, wherein the first via and the second via include at least one of titanium, aluminum and copper.

20. A non-volatile semiconductor memory as recited in claim 1, wherein the first via and the second via include at least one of titanium, aluminum and copper.

* * * * *